(12) United States Patent
Takeuchi et al.

(10) Patent No.: US 6,915,828 B2
(45) Date of Patent: Jul. 12, 2005

(54) PUNCH DIE FOR PUNCHING AND LAMINATING SIMULTANEOUSLY

(75) Inventors: Yukihisa Takeuchi, Nagoya (JP); Hiroyuki Tsuji, Nagoya (JP); Kazumasa Kitamura, Nagoya (JP); Yoshinori Yamaguchi, Nagoya (JP); Satoshi Matsubayashi, Kitakyusyu (JP); Syusaku Kabe, Kurate-gun (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/293,241

(22) Filed: Nov. 13, 2002

(65) Prior Publication Data

US 2003/0094242 A1 May 22, 2003

(30) Foreign Application Priority Data

Nov. 20, 2001 (JP) ........................................ 2001-353981

(51) Int. Cl.⁷ ............................ B32B 31/00; H05K 3/36
(52) U.S. Cl. ................. 156/515; 156/251; 156/264; 156/361; 156/513; 156/518; 156/530; 29/465; 29/467; 29/469; 29/738; 29/743; 29/759
(58) Field of Search .......................... 29/465, 467, 469, 29/738, 743, 759; 156/513, 251, 515, 518, 361, 530, 264

(56) References Cited

U.S. PATENT DOCUMENTS

| 2,618,311 A | * 11/1952 | Parker .......................... 156/264 |
| 6,502,302 B2 | 1/2003 | Takeuchi et al. .............. 29/830 |
| 6,637,102 B2 | * 10/2003 | Takeuchi et al. .............. 29/830 |
| 2002/0038507 A1 | 4/2002 | Takeuchi et al. | |

FOREIGN PATENT DOCUMENTS

| JP | 64-034697 | 2/1989 |
| JP | 02-151403 | 6/1990 |

* cited by examiner

Primary Examiner—Linda Gray
(74) Attorney, Agent, or Firm—Burr & Brown

(57) ABSTRACT

A punch apparatus for punching and laminating simultaneously a plural number of thin sheets is disclosed. This punch apparatus includes a punch provided on an upper portion of the punch apparatus, a die provided on a lower portion of the punch apparatus and used for punching a material to be processed, a stripper for guiding the punch during punching operation, a device for laminating punched materials using the punch as a laminating axis, a device for adjusting a relative position between the punch and the stripper when the upper and the lower portions of the punch apparatus are separated, and a device for adjusting a clearance between the die and the stripper during punching operation. The punch apparatus can open precisely almost straight very fine through-holes of a diameter of 100 μm or less even in a sheet of thin, soft and deformable material.

9 Claims, 11 Drawing Sheets

(DURING DRAW-UP) (DURING TRANSFER)

FIG. 4 - PRIOR ART
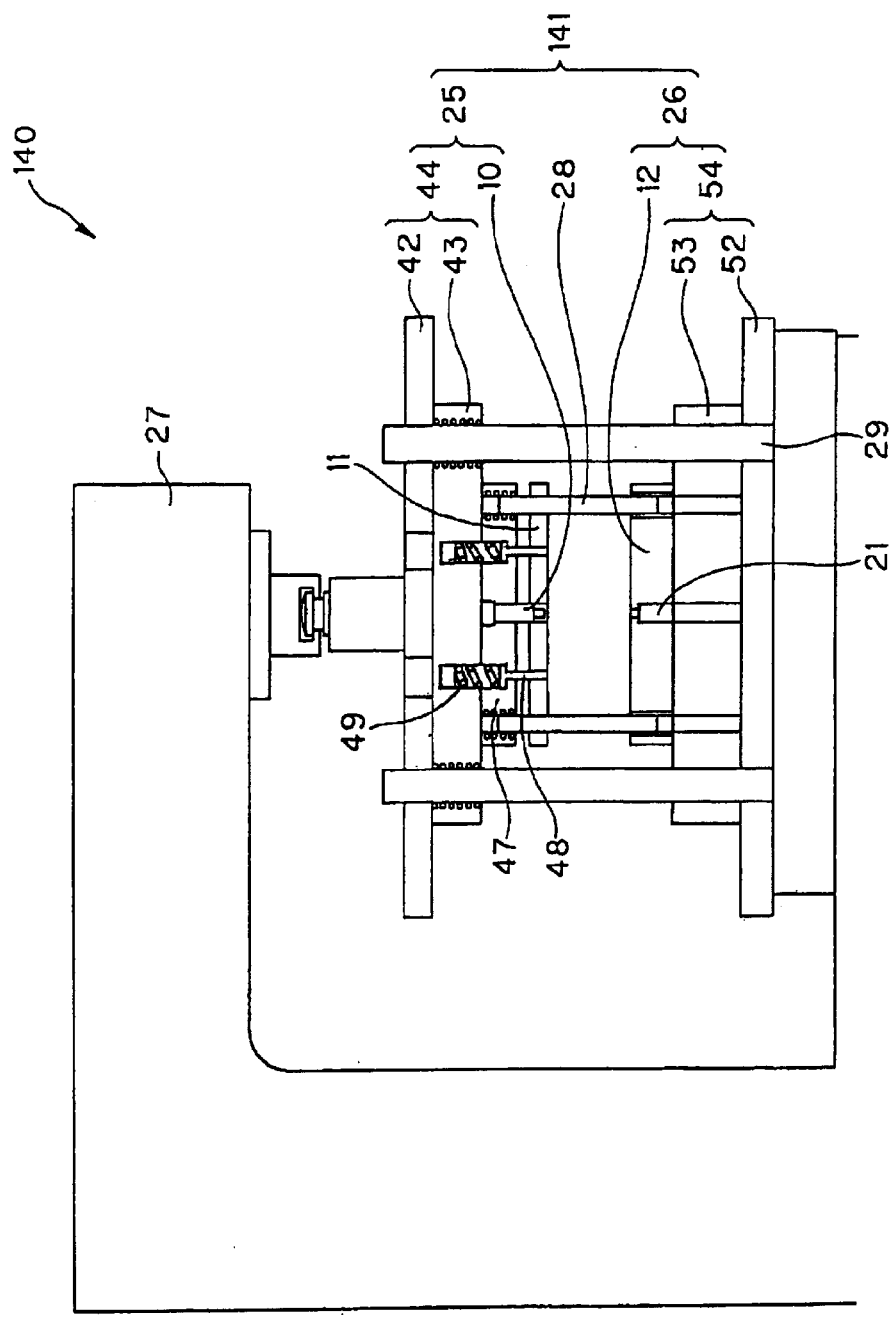

FIG.7(a) - PRIOR ART
FIG.7(b) - PRIOR ART
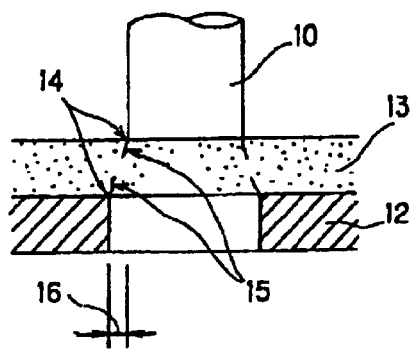
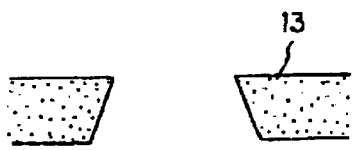
FIG.8(a)
FIG.8(b)
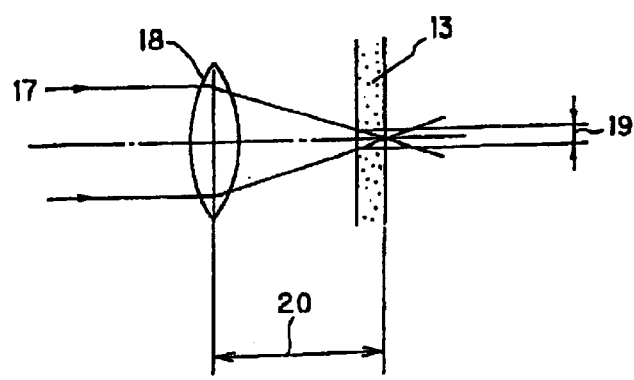

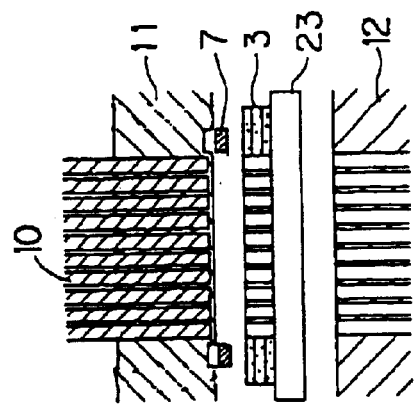
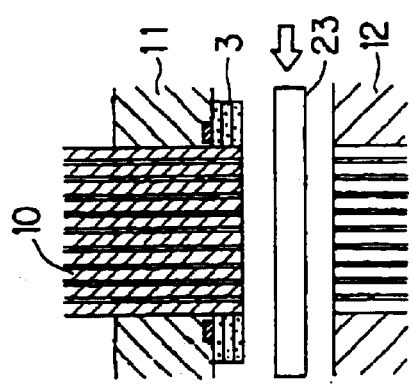
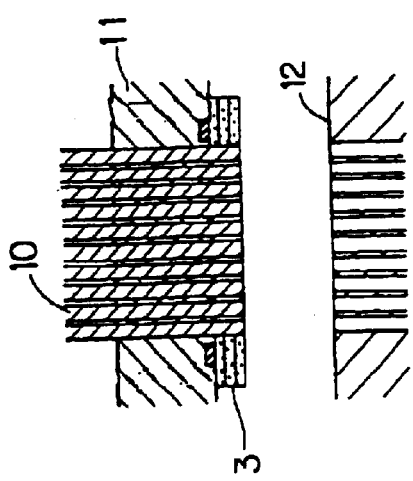

PUNCH DIE FOR PUNCHING AND LAMINATING SIMULTANEOUSLY

BACKGROUND OF THE INVENTION

1. Field of the Invention

The present invention relates to a punch die which can form through-holes with a high aspect ratio at a high precision and high density. More specifically, the present invention relates to a punch die for simultaneously punching and laminating a plurality of thin sheets of a material to be processed usable for the method of laminating a punched material in a punch. Using the punch die of the present invention, it is possible to form many through-holes through several sheets of a material laminated to a prescribed thickness with a high aspect ratio at the same high precision as in the case of making holes through one thin sheet of material, even if the material is so soft that the punched material may deform during handling after punching.

2. Description of the Background Art

All industrial products should be cheaper, lighter, and smaller. Minuteness is very important to increase an added value particularly for industrial parts with a number of electronic circuits mounted thereon. Development of mounting technologies backing up the industry is remarkable. For example, printed circuit boards on which electronic parts are mounted must have minute through-holes accurately drilled therethrough to ensure formation of high-density circuits while maintaining high reliability. Circuits for printed circuit boards are formed by making through-holes in substrates and inserting lead electrodes or burying conductive bodies in the through-holes. Such circuits have a risk of losing reliability due to short circuits and the like that may occur during use, if these circuits are not highly integrated or do not have high precision. Therefore, the technology of making through-holes with high precision is essential for industrial parts.

In recent years, along with the development of high integration technologies it has become necessary to make many minute through-holes in a given area of a printed circuit board. As a matter of course, such holes must be small and deep. Specifically, the holes must have a small diameter and a long axis, or, in other words, must have a high aspect ratio. It is necessary to form such through-holes at a high precision. Generally, when a through-hole is cylindrical in shape, the aspect ratio indicates a ratio of the diameter to the axis length. When a through-hole is not a cylinder, the aspect ratio indicates a ratio of the minimum distance from one position to the opposing position on the periphery of the opening of the through-hole to the axis length. Here, the minimum distance from one position to the opposing position on the periphery of the opening of a through-hole indicates a minimum distance S in FIGS. 5(a) and 5(b). Specifically, a through-hole with a high aspect ratio is a long narrow hole having a longer axis length as compared with the diameter or the minimum distance from one position to the opposing position on the periphery of the opening of the through-hole.

A stamping machine is popularly used for making small through-holes in such a material to be processed. The stamping machine is an apparatus having a punching die consisting of a punch and a die. The machine can make many holes at one time by pressing a material to be processed using such a punching die. Construction and operation of a well-known stamping machine will now be described taking a die as an example.

FIG. 4 is a side view showing an example of a punch die provided in a conventional stamping machine. A conventional punch die 141 provided in a stamping machine 140 consists of an upper portion of die 25 and a lower portion of die 26. The upper portion of die 25 is composed of a punch 10, a punch holder 47 holding the punch 10, a stripper 11 positioning the tip of the punch 10, and a die set (upper) 44. The lower portion of die 26 is composed of a die 12 and a die set (lower) 54 holding the die 12. The die set (upper) 44 is composed of a punch base 42 and a punch plate 43, whereas the die set (lower) 54 is composed of a die base 52 and a die plate 53.

The die 12 in which a spot 21 is formed is secured with the die set (lower) 54. The punch 10 is secured with the die set (upper) 44. The integrated punch 10/die set (upper) 44 runs along the guide post 29 for the upper portion of die, standing on the die set (lower) 54, and is brought down onto the die 12 by the pressure of a press machine 27. A material (not shown) to be processed placed on the die 12 is punched by the punch 10 descending from above the die 12, producing a punch hole therein.

When the punch 10 is drawn upwards the stripper 11 plays a role of holding the processed material and removing it from the punch 10 so that the material may not move upward together with the punch 10. The stripper 11 is suspendingly secured with a punch holder 47 and a stripper-suspending bolt 48, and pushed down by a stripper spring 49 inserted between the punch plate 43 and the stripper-suspending bolt 48. Therefore, the stripper 11 can freely move vertically with respect to the punch holder 47 to a predetermined extent. When the punch 10 is operated, specifically when a subguide post 28 descends along a guidepost hole in the die 12 along with downward movement of the upper portion of die 25, the stripper 11 guides the punch 10 and, at the same time, securely holds the material to be processed on the die 12 by its surface.

When the punch 10 punches the die 12 together with the material to be processed, the stripper 11 moves upward with respect to the punch 10 due to contraction of the stripper spring 49. Therefore, the punching operation of the punch 10 is not restricted. When the punch 10 is drawn up, the stripper 11 moves downward with respect to the punch 10 due to elongation of the stripper spring 49. This allows the punch 10 to be housed in the stripper 11 and also allows the upper portion of die 25 to return to the position before the punching operation.

A punching operation on a thick material using this type of conventional punch die is subject to a problem of insufficient accuracy due to the requirement of a wide clearance between the punch and die, if the thick material itself is a target of the punching operation. In addition, a thick material receives a larger shearing force than a thin material upon punching. When a through-hole density is large, the die must be provided with many holes. Therefore, the die may not withstand the large shearing force, resulting in deformation due to lack of rigidity. In a worse case, the die may fracture.

FIGS. 7(a) and 7(b) show a hole in a through-hole section made by punching using a conventional punch die. As shown in FIG. 7(a), when a material to be processed 13 placed on the die 12 is punched by a punch 10 with a clearance 16 between the punch 10 and the die 12, cracks 15 are produced at edges 14 of the punch 10 and die 12. These cracks 15 are produced within the width of the clearance 16. The accuracy of the through-holes fluctuates within the width of the clearance 16. As a result, when a through-hole is produced using a punch die, the cross-section of the through-hole through the processed material after punching generally has a tapered (downwardly expanding) configuration as shown in FIG. 7(b).

According to an article described in "Basic Machine Work (I)" published by The Nikkan Kogyo Shimbun Co., Ltd., the clearance 16 required for a punch die is 4–12% of the thickness for a thin plate and 18–26% of the thickness for a thick plate. The thicker the plate, the larger the clearance must be. Specifically, as mentioned above, the thicker the processed material, the lower is the precision of the through-hole. As a result, the punched holes fluctuate in size. It is difficult to produce a through-hole with a high aspect ratio and a small diameter at high precision.

A product with a desired thickness may be produced using the same type of conventional punch die. According to this method, a number of thin sheets of material to be processed are punched instead of punching a thick plate at one time, and the punched sheets are transferred and laminated to produce a product with the target thickness. When a hole is made using this method, each sheet is provided with a hole with a high precision because the sheet processed in each punching operation is thin. In addition, a shearing force produced by the punch and die is small, enabling the stamping machine to produce holes at a high density. However, the method requires not only a jig to transfer the processed sheets of the material and a space for laminating the punched sheets, but also additional process steps, resulting in lower productivity and high cost. In addition, a guide pin to precisely laminate the punched sheets is necessary, which requires an additional step of opening otherwise unnecessary holes through the material to be processed. Moreover, when a soft material that may be deformed after punching is used, the position of the holes may deviate while the punched sheets are transferred for lamination. The resulting laminated material with a prescribed thickness may have through-holes with impaired precision. Therefore, it is difficult to produce through-holes with a high aspect ratio and a small diameter at a high density using this method.

As a method of making through-holes without using a punch die, a hole-opening process using laser beams is known. This is a device for processing the material by focusing laser beams onto the object to be processed. Focusing laser beams employed as a principle of the laser beam processing inevitably produces through-holes tapering in the direction of the laser beams. The process also has a fundamental problem of producing only inaccurate holes if the target through-holes have a high aspect ratio.

FIGS. 8(a) and 8(b) show a boring operation using laser beams. In a laser beam machine shown in FIG. 8(a), parallel beams 17 passing through a condensing lens 18 are converged at a focal distance 20 to make a hole. The larger the distance from the focal point, the larger are the width 19 of laser beams and the diameter of the through-holes to be produced. Therefore, the thicker the sheet of the material to be processed, the larger is the diameter of the through-hole produced in the laser beam inlet side when the boring operation is carried out on the laser beam exit side. As a result, a through-hole with an upwardly tapered configuration as shown in FIG. 8(b) is formed.

In addition, since heat energy is used in the laser beam process, the processed material is deformed with heat. This result in formation of denatured layers, which causes another problem of fluctuation in the through-hole diameters. Also with respect to this problem, the thicker the material, the larger is the amount of laser beams (or heat energy) required. Therefore, the thicker the processed material, the lower is the accuracy of the through-holes. For these reasons, it is also difficult to produce through-holes with a high aspect ratio and a small diameter at a high density using a laser process machine.

As mentioned above, since mounting technology in the industrial field, especially in the field of electronic parts, has become highly integrated, industrial parts such as interconnecting substrates for mounting electronic parts are required to be provided with minute through-holes at a high density. A device for forming through-holes with a high aspect ratio at a high precision without producing damage, even when the materials used for such industrial parts are so soft that the industrial parts may be deformed in terms of both dimension and shape according to handling after processing, has been required. However, conventional through-hole making processes using a punch die or laser beams do not satisfy this requirement.

To satisfy such a requirement, the inventors of the present invention have conducted extensive studies on hole making techniques using a punch die. As a result, the inventors have found that that a method of punching holes in a material to be processed using a punch die consisting of a punch and a die and, at the same time, laminating the material without drawing it from the punch is effective in obtaining a processed material with a prescribed thickness. More specifically, after making a hole through the material to be processed, that material is caused to adhere to a stripper and raised from the die without being drawn out from the punch. Then, the punch is returned in such a manner that it is slightly drawn out from the lowest part of the hole formed in the material. The next material is processed in the same manner. Specifically, after making a hole using a punch, the material is caused to adhere to the bottom of the previously processed material and raised from the die without being drawn out from the die. Then, the punch is returned in such a manner that it is slightly drawn out from the lowest part of the hole formed in the raised material. The laminated material with a prescribed thickness obtained by repeating this procedure was found to have through-holes with a high aspect ratio and a small diameter formed therein at a high precision.

Since the punch is not drawn out from the hole of the processed material up to the completion of punching operation, during which several sheets of processed material are laminated using the punch as a lamination axis in the punch die, deformation of the hole can be prevented. In addition, because the punch is secured to the processed material, there should be no changes between the center axis of the punch and the center axis of the stripper hole in terms of both the direction of deviation and the size. Therefore, it is possible to make a through-hole with a high precision in a processed material having a prescribed thickness. The through-hole boring at a high precision makes it possible to produce a high-density through-hole section. The processed material can be suitably used as an industrial part such as an electronic part required for a highly developed mounting technology.

In the conventional punch die typified by the punch die 141 provided in the stamping machine 140 shown in the FIG. 4, although the stripper 11 is free with respect to the punch 10 and the die set (upper) 44, the positions of the punch 10 and the stripper 11 are fixed when the punch 10 is drawn up and the punch 10 is usually stored in the stripper 11. Therefore, the operation of holding the punch without drawing it out from the hole of the processed material up to the completion of the punching operation, while laminating several sheets of processed material using the punch 10 as a lamination axis is actually impossible.

An additional problem with a conventional punch die is the low precision of the through-hole if the processed material is soft and easily deformed. In the punching operation, before the punch 10 makes a hole through the material to be processed, the stripper 11 hits the material to be processed placed on the die 12, adding a compressive force to the material. Since the hole is opened by the punch 10 with the processed material placed on the die 12 being pressed due to the compressive force, the hole precision is impaired with respect to both the location and shape to the extent of form-return of elastic deformation after punching.

Therefore, the punch die for forming a through-hole with a high aspect ratio and small diameter at a high precision in a material to be processed must be provided with functions which have not been possessed by conventional punch dies. For example, capabilities such as laminating several sheets of processed material using the punch as a laminating axis, while changing the length of the punch protruding from the bottom surface of the stripper when the punch is raised each time the material is punched, the capability of suppressing generation of a compressive force in a manner whereby the stripper or the processed materials through which holes have been opened laminated in the punch may not directly come onto the processed material during the punching operation, and the like.

The present invention has been achieved in view of the above problems and requirements. An object of the present invention is therefore to provide a punch die suitable for a simultaneous punching-lamination process which can open extremely small through-holes almost straight, having a diameter of 100 $\mu$m or less, for example, and a ratio of the axis length to the diameter larger than a prescribed value, and a high precision equivalent to holes made through a sheet of thin material, even if the material to be processed is soft and deformable. Industrial parts having a specified thickness and many through-holes with a high aspect ratio and small diameter can be produced using the punch die, thereby contributing to increased integration in the mounting technology for industrial parts, including electronic equipment as a major product.

SUMMARY OF THE INVENTION

Specifically, the present invention provides a punch apparatus for punching and laminating simultaneously a plural number of thin sheets. The punch apparatus comprises a punch being provided on an upper portion of the apparatus, a die for punching out a material to be processed provided on a lower portion of the apparatus and a stripper for guiding the punch. The punch defines a lamination axis during lamination of the material to be processed. The punch apparatus further comprises a device for adjusting a relative position between the punch and the stripper and a device for adjusting a clearance between the die and the stripper during punching operation when the punch apparatus is in a state being separated between an upper portion and a lower portion of the punch apparatus.

In a preferred embodiment of the present invention, the punch apparatus is provided with a stripper hanger which holds down the stripper with respect to a punch holder for holding the punch and suspends the stripper adhering thereto. The stripper hanger is comprised of a shaft with a head on the upper end, the lower end being secured with the stripper, and is further provided, on the upper end thereof, with a head placed on the punch holder or a step cam formed above the punch holder. The device for adjusting the relative position between the punch and the stripper is a mechanism capable of changing the step of the cam being contact with the head of the device. This device for adjustment of the relative position preferably automatically changes the step of the cam being contact with the head of the device.

In another preferred embodiment of the present invention, the punch apparatus has a stripper stopper, which is provided through the die, and a die plate for holding the die, and receives the stripper during punching operation. The stripper stopper comprises a shaft of which the upper end protrudes from the die and the lower end contacts the die plate or a step cam formed below the die plate. The device for adjusting the clearance is a mechanism capable of changing the step of the cam being contacted with the lower end of the device. This device preferably changes the step of the cam, with which the lower end contacts, automatically. In addition, the clearance being adjustable by this device is preferably about 5–15 $\mu$m larger than the total thickness of the laminated materials which are present between the die and the stripper.

BRIEF DESCRIPTION OF THE DRAWINGS

FIG. 4 shows a side view of an embodiment of a conventional punch die.

FIG. 5($a$) is an explanatory drawing showing an example of a shortest distance between through-holes and FIG. 5($b$) is an explanatory drawing showing another example of a shortest distance between through-holes.

FIGS. 7($a$) and ($b$) are drawings for illustrating through-holes made by a hole boring process using a conventional punch die. FIG. 7($a$) is a schematic drawing showing crack generation and FIG. 7($b$) is an explanatory drawing showing a cross-sectional configuration of the processed material after being punched out.

FIGS. 8($a$) and ($b$) are drawings for illustrating a through-hole boring process using a laser. FIG. 8($a$) is a schematic drawing showing a method of laser beam processing and FIG. 8($b$) is an explanatory drawing showing a cross-sectional configuration of the material processed by laser beams.

FIGS. 9($a$) and ($b$) are drawings for illustrating an industrial part obtained by the hole boring process using the punch die for punching and laminating simultaneously a plurality of thin sheets according to the present invention.

FIG. 10(a) shows a first sheet preparation step, in which a first thin sheet of the material to be processed is placed on a die. FIG. 10(b) shows a first sheet punch-out step, in which the first sheet is punched. FIG. 10(c) shows a second sheet preparation step. FIG. 10(d) shows a second sheet punch-out step. FIG. 10(e) shows a sheet punch finish step, wherein after punching and laminating all sheets, the laminated processed material is removed from a stripper.

FIG. 11(a) shows a first sheet preparation step, in which a first thin sheet of the material to be processed is placed on a die. FIG. 11(b) shows a state in which a stripper is caused to descend and is applied to the material to be processed in the first sheet punch-out step. FIG. 11(c) shows a state in which a punch has been punched into the die in the first sheet punch-out step. FIG. 11(d) shows a state in which the punch is drawn up slightly from the lowest part of the processed material, with the stripper being applied to the material to be processed on the die, in the first sheet punch-out step. FIG. 11(e) shows a state in which a stripper has been drawn up in the first sheet punch-out step.

FIGS. 12(a) to (c) are other explanatory drawings for illustrating another example of hole boring using the punch die for punching and laminating simultaneously a plurality of thin sheets according to the present invention. FIG. 12(a) shows a sheet punch-out completion step A for punching and laminating a desired number of sheets (n=3) of the material to be processed and drawing up the stripper. FIG. 12(b) shows a sheet punch-out completion step B for inserting a work-receiving jig and putting it on a die. FIG. 12(c) shows a sheet punch-out completion step C for removing the laminated processed material from the stripper and transferring it onto the work-receiving jig.

FIG. 13(a) shows a first sheet preparation step, in which a first thin sheet of the material to be processed is placed on a die. FIG. 13(b) shows a first sheet punch-out step, in which the first sheet is punched. FIG. 13(c) shows a second sheet preparation step. FIG. 13(d) shows a second sheet punch-out step. FIG. 13(e) shows a third sheet preparation step. FIG. 13(f) shows a sheet punch completion step, wherein after punching and laminating all sheets, the laminated processed material is removed from a stripper.

DETAILED DESCRIPTION OF THE INVENTION

Figure 1:
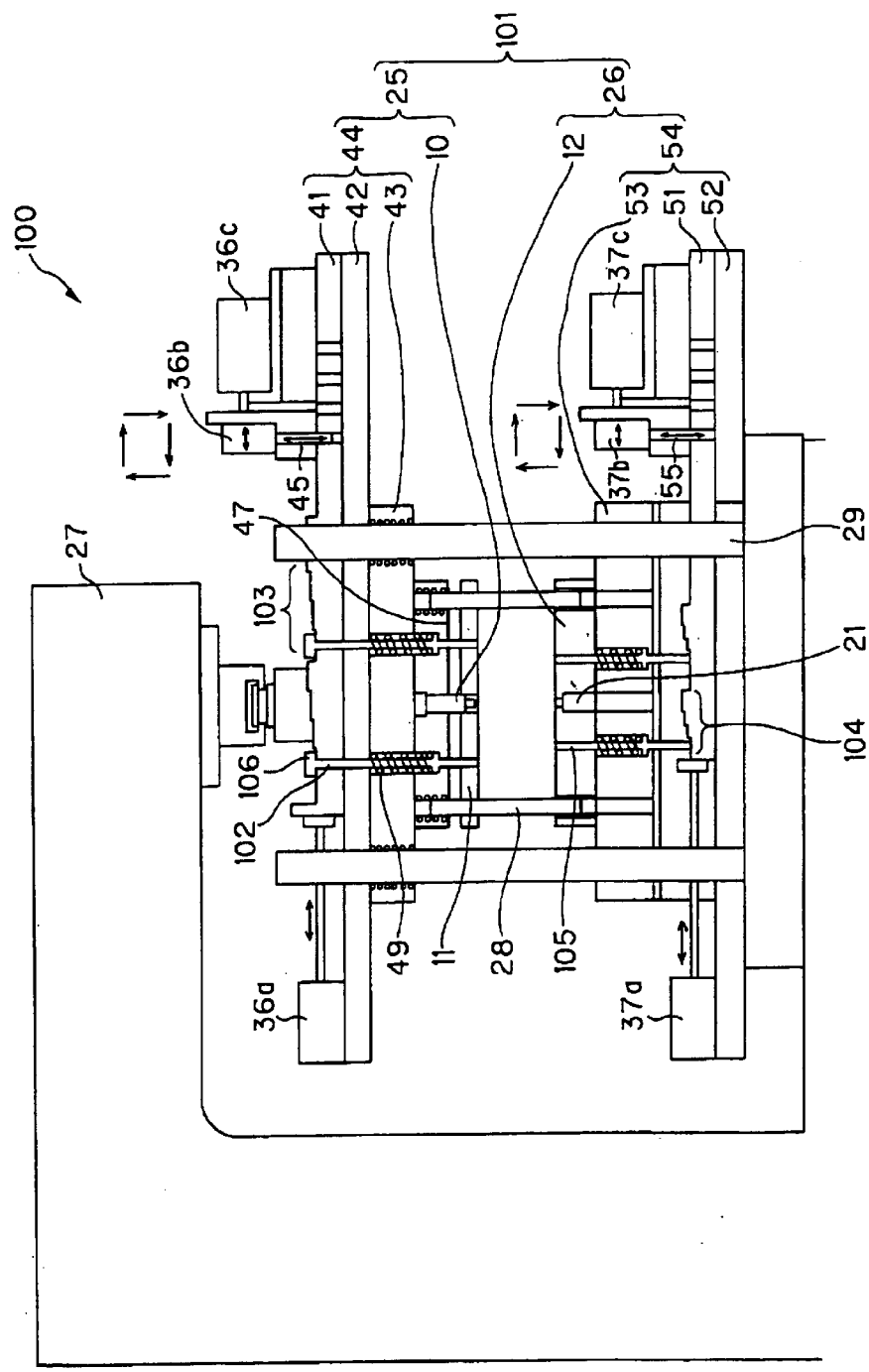
FIG. 1 is a side view of one embodiment of the punch die for the simultaneous punching-lamination process of the present invention.

Preferred embodiments of the present invention will now described taking a punch apparatus for a simultaneous punching-lamination process. The present invention, however, should not be construed as being limited to these embodiments. Various alterations, modifications, and improvements are possible within the scope of the present invention by persons skilled in the art. In the present specification, a through-hole and a hole both indicate a hole penetrating from one surface of a material having a thickness through the other surface. The term "hole" is used to indicate a hole made through a sheet of material which composes a laminated body.

The present invention relates to a punch apparatus for punching and laminating simultaneously a plurality of the thin sheets. The term "punching and laminating simultaneously a plurality of the thin sheets" means an operation in which a plurality of holes is punched through a material to be processed using a punch, and each of the punched materials is simultaneously laminated, using a punch as a lamination axis without being drawn out from the punch. Since the punch is not removed from the holes of the punched material until the end of the punching operation in the simultaneous punching-lamination process, deformation of holes can be prevented. In addition, because the punch is secured to the processed material, it is possible to make a hole with a higher precision through the material to be processed having a prescribed thickness.

The punch apparatus for the simultaneous punching-lamination process of the present invention is characterized by having a device for adjusting the relative position of the punch and stripper in a desired condition when the apparatus is separated into the upper portion of the apparatus in which the punch is installed and the lower portion of the apparatus in which the die is installed. Here, the term "separated" indicates the condition in which two objects are separated by an empty space, but not the condition in which two objects are separated via a processed material, for example. The term "relative position" means a position difference in the vertical direction. More specifically, the relative position indicates the position difference between the tip of the punch and the bottom surface of the stripper in the vertical direction. Using the device for adjusting the relative position, the length of the punch protruding from the stripper can be gradually increased as the punched materials are laminated in the punch without storing the punch in the stripper when the punch is drawn up, whereby the punch may be retained without removing it from the holes of the punched material until the simultaneous punching-lamination operation is completed. Since the punch functions as a lamination axis, it is possible to pile up the punched holes at a high positioning precision. In addition, deformation of the hole can be prevented by the punch. Moreover, since the punch is secured to the processed material, there should be no changes between the center axis of the punch and the center axis of the stripper hole in terms of both in the direction of deviation and the size. Therefore, through-holes with a high aspect ratio can be formed in the processed material at a high precision and high density.

In addition, the punch apparatus for punching and laminating simultaneously a plurality of thin sheets according to the present invention is characterized by having a device for adjusting the clearance between the die and the stripper during the punching operation. Before the punch drills a hole, the punched material laminated in the punch (the stripper in the case of the initial drilling operation, herein after the same) comes onto the material to be processed placed on the die, whereby a compression force is applied to both the processed material through which holes have already been drilled and laminated in the punch and the material to be processed placed on the die, through which holes are still to be drilled. This compression force may deform the processed material and may increase the risk of impairing precision of holes. This is particularly remarkable in a soft material. This problem can be overcome if the clearance between the die and the stripper is adjusted by moving the device for adjusting the clearance so that the processed material through which holes have been opened, laminated in the punch, may not come onto the material to be processed on the die when the punch is drawn out. Therefore, it is possible to make through-holes with a high aspect ratio at a high precision in a soft and easily deformable material. Since the clearance to be provided between the die and stripper changes as the processed material is laminated in the punch, it is necessary to adjust the size of the clearance.

In the process for making holes through a material with a certain thickness used for industrial parts by using a conventional punch die, the thicker the processed material the lower the precision of the holes. However, if the punch apparatus for punching and laminating simultaneously according to the present invention is used, it is possible to form high density through-holes with a high aspect ratio at the same high precision as in the case of making holes through a thin material, even in the case that the material is soft and quite susceptible to deformation.

Figure 9A:
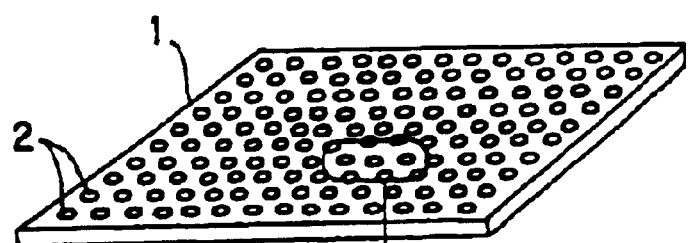
FIG. 9(a) is a perspective view showing an example of an industrial part having through-holes with a high aspect ratio and FIG. 9(b) is an enlarged view of the through-holes with a high aspect ratio of FIG. 9(a).
Figure 9B:
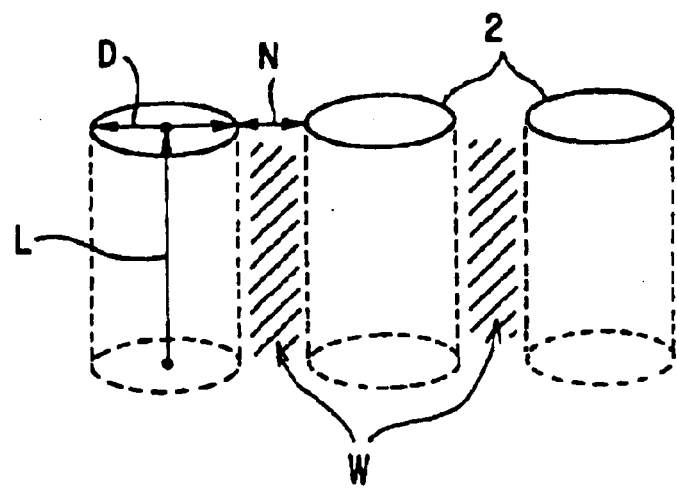

High-density through-holes with a high aspect ratio required for interconnecting substrates for electronic circuits and the like will now be described. The through-holes shown in FIGS. 9(a) and 9(b) have the following characteristics. FIG. 9(a) shows an example of an industrial part 1 having through-holes 2 with a high aspect ratio. FIG. 9(b) shows an enlarged view of part of the FIG. 9(a). The industrial part 1 preferably has long and narrow through-holes, of which the ratio of the through-hole diameter D to the through-hole axis length L, shown in FIG. 9(b), is about from 1:1 to 1:15. In addition, the through-holes must be formed in the industrial part 1 at a high density such that the ratio of the through-hole interval N to the through-hole axis length L is about from 1:1 to 1:15. Both the through-hole diameter D and the through-hole interval N are in the range of several tens of micron meters ($\mu$m). The industrial part 1 must be provided with a number of such through-holes with a size of 100 $\mu$m or less precisely arranged at intervals of 100 $\mu$m or less.

Figure 6:
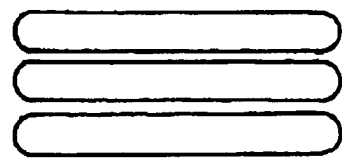
FIG. 6 is an explanatory drawing showing an example of a cross-sectional configuration of a through-hole with a high aspect ratio which can be formed in a material to be processed using the punch die for the simultaneous punching-lamination process of the present invention.

A through-hole with a high precision means a through-hole with an almost constant through-hole diameter D through the entire through-hole axial length L. In other words, such a hole penetrates straight through the thickness of the processed material and, if the cross-section of the through-hole 2 is a circle, the through-hole 2 should be an almost circular cylinder. The cross-section of the through-hole 2 need not necessarily be a circle, but may be a long and narrow oval, as shown in FIG. 6 for example, or any other shape. If the through-holes 2 with insufficient precision are formed at a high density, two or more through-holes may associate due to absence of the through-hole intervals N or the strength may become insufficient due to too small through-hole intervals N. Problems such as bending of a wall W between one through-hole 2 and another through-hole 2 may occur, resulting in deformation, breakage, and the like. Reliability of the product as an industrial part is unduly affected. These problems, however, can be obviated if the products with high shape precision can be formed even if the wall W is thin.

The soft material deformable by handling after punching, which is the object to be processed by the punch apparatus for punching and laminating simultaneously a plurality of thin sheets according to the present invention, indicates a material having a Young's modulus of elasticity of less than 3,000 kgf/mm$^2$ and a tensile strength of less than 20 kgf/mm$^2$. Examples of such a material include polyethylene (Young's modulus: 310 kgf/mm$^2$, tensile strength: 3 kgf/mm$^2$) polyimide (Young's modulus: 430 kgf/mm$^2$, tensile strength: 18.3 kgf/mm$^2$) reinforced plastic (Young's modulus: 2,500 kgf/mm$^2$, tensile strength: 19 kgf/mm$^2$), green sheet (Young's modulus: 7.1 kgf/mm$^2$, tensile strength: 0.7 kgf/mm$^2$), and the like. Materials having a Young's modulus of elasticity of 3,000 kgf/mm$^2$ or more and a tensile strength of 20 kgf/mm$^2$ or more, which may be deformed by handling after punching, for example, a thin metal plate, can also be the object to be processed by the punch apparatus for punching and laminating simultaneously a plurality of thin sheets according to the present invention.

Figure 2:
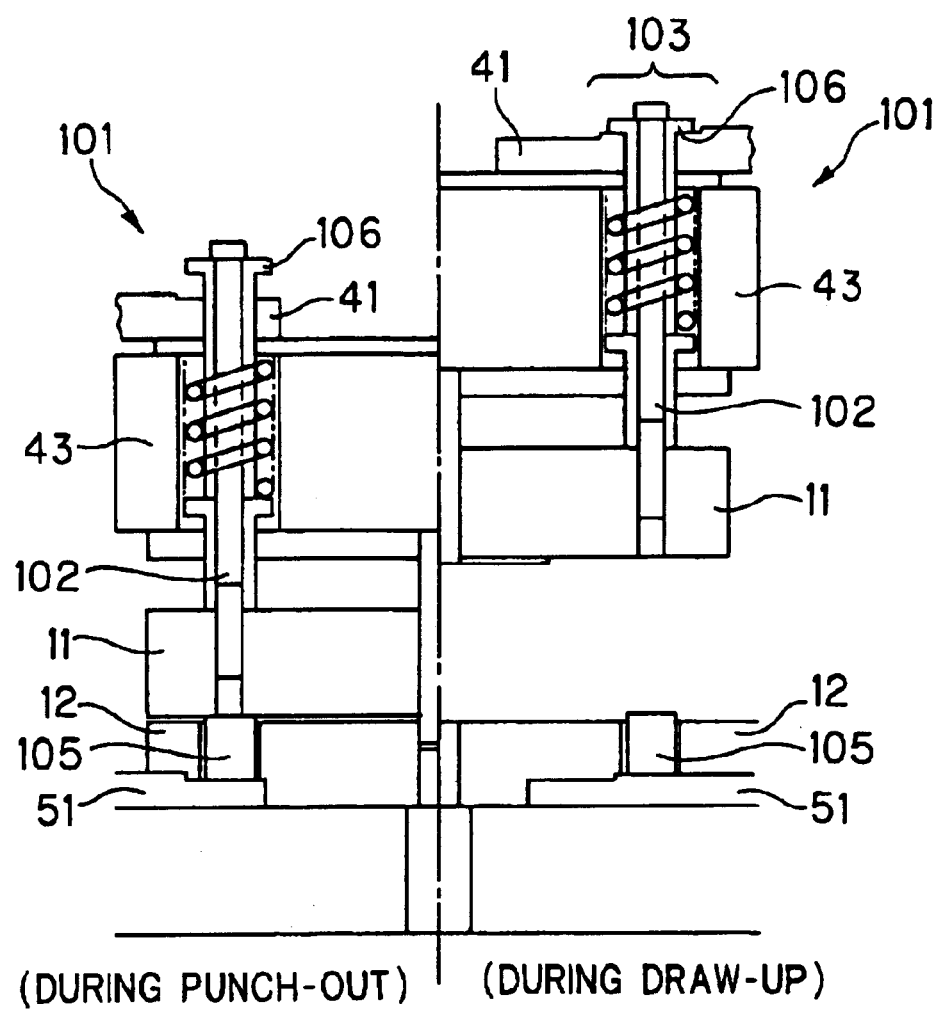
FIG. 2 is a partially enlarged side view of a punch die for the simultaneous punching-lamination process of the present invention, wherein the left side shows the state of the punch die during the punching operation and the right side shows the state during draw-up.

The punch apparatus for punching and laminating simultaneously a plurality of thin sheets according to the present invention will now be described referring to FIGS. 1 and 2. FIG. 1 is a side view showing an example of a stamping machine equipped with the punch apparatus for punching and laminating simultaneously a plurality of thin sheets according to the present invention. FIG. 2 is an enlarged side view of part of a punch apparatus for punching and laminating simultaneously a plurality of thin sheets according to the present invention, wherein the left side shows the state of the punch apparatus during the punching operation and the right side shows the state during draw-up. FIG. 2 is a drawing similar to the FIG. 1, except that the punch apparatus is provided with a stripper hanger slightly different from that shown in FIG. 1. A punch apparatus 101 of the present invention provided in a stamping machine 100 consists of an upper portion of die 25 and a lower portion of die 26. The upper portion of die 25 is composed of a punch 10, a punch holder 47 holding the punch 10, a stripper 11 positioning the tip of the punch 10, and a die set (upper) 44. The lower portion of die 26 is composed of a die 12 and a die set (lower) 54 holding the die 12. The die set (upper) 44 is composed of a punch slide plate 41, a punch base 42, and a punch plate 43, whereas the die set (lower) 54 is composed of a die slide plate 51, a die base 52, and a die plate 53. Only one punch 10 is shown in FIG. 1. Although the number of punches 10 may be one, usually a plurality of punches 10 is provided. When the processed material through which through-holes are formed is used as an industrial part such as an electronic multi-layer printed circuit board, the punch apparatus 101 used for the punching operation is equipped with many punches 10 at a high density.

The die 12 in which a spot 21 is formed is secured with the die set (lower) 54. The punch 10 is secured with the punch holder 47. The integrated punch 10/punch holder 47/die set (upper) 44 runs along the guide post 29 for the upper portion of die standing on the die set (lower) 54, and is brought down onto the die 12 by the pressure of a press machine 27. A material (not shown) to be processed placed on the die 12 is punched by the punch 10 descending from above the die 12, producing a punch hole therein.

The stripper 11 is suspendingly secured with a stripper hanger 102 that is stretchingly attached to the die set (upper) 44. The term "stretchingly attached" herein means that the object is attached via an elastic material. Specifically, the stripper hanger 102 penetrates through the punch plate 43, is attached to the punch base 42 via a spring, and is suspended by a head 106 which is not secured to the punch base 42. The stripper 11 can freely move vertically with respect to the die set (upper) 44 to a predetermined extent. When the punch 10 is operated, specifically when a subguide post 28 descends along a guidepost hole in the die 12 along with downward movement of the upper portion of die 25, the stripper 11 which is secured with the stripper hanger 102 guides the punch 10 and, at the same time, securely holds the material to be processed on the die 12 by its surface. When the punch 10 punches the die 12 together with the material to be processed, the stripper 11 moves upward with respect to the punch 10 due to contraction of the stripper spring 49. Therefore, the punching operation of the punch 10 is not restricted. When the punch 10 is drawn up, the stripper 11 moves downward relatively with respect to the punch 10 due to the elongation of the stripper spring 49. This allows the punch 10 to be housed in the stripper 11 and also allows the upper portion of die 25 to return to the position before the punching operation.

In the simultaneous punching-lamination process, a hole is punched through a material to be processed using the punch 10 and the punched material is simultaneously laminated in the punch 10 without being drawn out from the punch 10, with the punched material adhering to the bottom surface of the stripper 11 (or, after the second punching operation and thereafter, a punched material laminated by the immediately preceding punching operation). For this reason, it is desirable that the punch 10 be designed to protrude from the bottom surface of the stripper 11 by the thickness of the processed material to be laminated, without being stored in the stripper 11. Specifically, it is necessary to set the relative position of the punch 10 and stripper 11 to a desired condition when the upper portion of die 25 is drawn up (device for adjusting the relative portion).

The device for adjusting the relative portion between the punch and stripper is a mechanism for changing the step of a step cam 103 being contact with the head 106 of the device installed on the upper end of the stripper hanger 102. The step cam 103 forms a couple with the stripper hanger 102 and is provided with steps. Since the tip of the punch 10 in the elevated position is always the same and the lower end of the stripper hanger 102 is secured with the stripper 11, the bottom of the stripper 11 vertically changes its position (when viewing from the top of the punch 10, for example) in accordance with change in the steps of the step cam 103 on which the head 106 rests. Therefore, it is possible to gradually increase the length of the punch 10 protruding from the stripper 11 as the processed material is laminated in the punch 10 by using the device for adjusting the relative position, whereby one may retain the punch 10, without removing it from the hole of the processed material, until the simultaneous punching-lamination process is completed. There is no specific limitation to the number of steps for the step cam 103. The step cam 103 may be provided with any optional number of steps according to the number of sheets of the processed material to be laminated. The height of the step of the cam 103 may be equivalent to the thickness of the processed material to be laminated.

The step cam 103 for the punch apparatus 101 shown in FIG. 1 has four steps and can laminate three sheets of the material to be processed. In the punch apparatus 100 shown in FIG. 1, the lowest step of the step cam 103 has the head 106 resting on it. In this instance, the punch 10 is just stored in the stripper 11. The bottom of the stripper 11 is elevated, as the step of the step cam 103 on which the head 106 is resting becomes higher. This causes the position of the tip of the punch 10 to relatively descend, thereby causing the tip of the punch 10 to protrude from the bottom of the stripper 11. In this manner, the punch 10 is not drawn out from the hole of the processed material to be laminated.

There is no limitation to the mechanism for changing the step of the step cam 103 on which the head 106 on the upper end of the stripper hanger 102 is placed. For example, as shown in FIG. 1, the step cam 103 is provided on the upper surface of the punch slide plate 41. When the head 106 is elevated from the upper surface of the punch slide plate 41 due to contraction of the spring stretchingly attached to the stripper hanger 102 during the punching operation, the punch slide plate 41 is moved to the left, in the case of FIG. 1, by drivers 36b, 36c for the punch base 42 until the head 106 comes onto the next upper step of the step cam 103. Specifically, a rod 45 secured with the driver 36b and inserted in a hole in the punch slide plate 41 is moved to the left by the driver 36c, as shown in FIG. 1. This causes the punch slide plate 41 to move to the left with respect to the punch base 42 as shown in FIG. 1. Then, the upper portion of die 25 is elevated to cause the head 106 to rest on the step cam 103, thereby elevating the stripper 11 with respect to the punch 10 by one step of the step cam 103. To elevate the stripper 11 with respect to the punch 10 by one more step, the rod 45 secured with the driver 36b is caused to be elevated by the driver 36b, thereby removing the rod 45 from the hole in the punch slide plate 41. Next, the rod 45 is moved to the right by the driver 36c and is caused to descend by the driver 36b until inserted into the hole in the punch slide plate 41. Then, the punch slide plate 41 is moved to the left by driving the driver 36c to the left. (A driver 36a is provided to remove the processed material from the stripper when the necessary number of sheets have been punched and laminated in the stripper 11.) Each of the drivers 36a to 36c may be formed from an air cylinder, motor, a transmitter, and the like, for example. The step of the step cam 103 on which the head 106 is rested can be easily and automatically changed in relation to punching operation by using such a mechanism, resulting in an increased punching process speed. The mechanism thus contributes to improvement of productivity.

In the simultaneous punching-lamination process, especially when the material to be processed is soft and susceptible to deformation, the punched material laminated in the punch 10 comes onto the material to be processed on the die 12 during the punching operation, whereby a compression force is applied to both the processed material through which holes have already been drilled and laminated in the punch 10 and the material to be processed placed on the die 12, through which holes are still to be drilled. This compression force may impair precision of holes. To avoid this, it is desirable to provide a clearance between the die 12 and the stripper 11 during the punching operation.

In the punch apparatus 101 shown in the FIG. 1, a stripper stopper 105 stretchingly attached to the die set (lower) 54 on the upper surface of the die 12 protrudes and a clearance is provided between the die 12 and the stripper 11. The stripper stopper 105 penetrates through the die plate 53 and is attached to the die base 52 via a spring so that the stripper stopper 105 is provided with a vertically movable allowance to a certain extent. When punching, specifically, when the upper portion of die 25 comes to the lowest position, the stripper stopper 105 form a clearance between the die 12 and stripper 11, whereby the risk that the processed material laminated in the punch 10 comes onto the material to be processed on the die 12 and a compression force is applied to both materials, is prevented.

The clearance is preferably larger by about 5–15 $\mu$m than the total thickness of the sheets of processed material which are present between the die 12 and the stripper 11. The clearance in this range prevents the processed material from being crushed by the stripper 11, even if the thickness of the processed material fluctuates or the stripper 11 and the die 12 are deformed by the punching operation. The sum of the thickness of the sheets of the processed material already punched and laminated in the punch 10 and the thickness of the sheets of the material to be processed on the die 12 increases as the processed material is laminated in the punch 10. Therefore, a mechanism for adjusting the clearance between the die 12 and stripper 11 (the device for adjusting the clearance) corresponding to the change of thickness is required.

The device for adjusting the clearance is a mechanism for changing the step of the step cam 104 on which the lower end of the stripper stopper 105 is placed. The step cam 104 forms a couple with the stripper stopper 105 and is provided with steps. Since a downward pressure is applied to the lower portion of die 26 from upper portion of die 25 during the punching operation, the height of the stripper stopper 105 protruding from the die 12 changes as the step of the step cam 104 on which the lower end of the stripper stopper 105 rests changes. Accordingly, the clearance between the die 12 and stripper 11 changes. Therefore, it is possible to gradually increase the height of the stripper stopper 105 protruding from the die 12 as the processed material is laminated in the punch 10 by using the device for adjusting the clearance. In this manner, the situation wherein the processed material laminated in the punch 10 touches the material to be processed on the die 12, resulting in creation of a compression force between them, can be obviated until the completion of the simultaneous punching-lamination operation. There is no specific limitation to the number of steps for the stem cam 104. The step cam 104 may be provided with any optional number of steps according to the number of sheets of the processed material to be laminated. The height of the step of the step cam 104 may be equivalent to the thickness of the processed material to be laminated. However, when the step of the step cam 104 on which the lower end of the stripper stopper 105 is placed is the lowest step, the stripper stopper 105 does not protrude from the die 12. In such a case, when the step cam 104 has moved one more step after an additional sheet of the material to be processed had been set on the die 12, the height of the stripper stopper 105 protruding from the die 12 is preferably about 5–15 μm larger than the thickness of one sheet of the material to be processed.

The step cam 104 for the punch apparatus 101 shown in FIG. 1 has four steps and can laminate three sheets of the material to be processed. Since the upper end of the stripper stopper 105 protruding from the die 12 is elevated as the step of the cam 104 on which the lower end of the stripper stopper 105 rests becomes higher, there should be no risk that the processed material laminated in the punch 10 touches the material to be processed on the die 12, resulting in creation of a compression force between them. There is no limitation to the mechanism for changing the step of the cam 104 on which the lower end of the stripper stopper 105 is placed. For instance, it is possible to provide the step cam 104 on the upper surface of a die slide plate 51 and cause the die slide plate 51 to move to the left in FIG. 1 using drivers 37b and 37c provided in the die base 52, so that the stripper stopper 105 may be elevated as shown in FIG. 1. Specifically, a rod 55 secured with the driver 37b and inserted in a hole in the die slide plate 51 is moved to the left in FIG. 1 by the driver 37c. This causes the die slide plate 51 to move to the left in FIG. 1 with respect to the die base 52. To elevate the stripper stopper 105 by one more step, the rod 55 secured with the driver 37b is caused to elevate by the driver 37b, thereby removing the rod 55 from the hole in the die slide plate 51. Next, the rod 55 is moved to the right by the driver 37c and then is caused to descend by the driver 37b until inserted into the die slide plate 51. Then, the die slide plate 51 is moved to the left by driving the driver 37c to the left. A driver 37a is provided to remove the processed material from the stripper 11 after the necessary sheets of the material to be processed have been simultaneously punched and laminated in the stripper 11. The step cam 104 moved to the left in FIG. 1 in the simultaneous punching-lamination operation is returned to the right so that the lowest step of the step cam 104 may have the stripper stopper 105 resting on it.

The spring used for the stripper stopper 105 has a weaker spring force than the stripper spring 49 used for the stripper hanger 102, because the spring used for the stripper stopper 105 only holds the stripper stopper 105 and prevents it from coming out upward. Therefore, the operation of causing the head 106 to rest on the step cam 103 while the two parts are separated is not necessary in the case of putting the lower end of the stripper stopper 105 on the step cam 104. These two parts may not be separated during this operation. In the same manner as in the case of the device for adjusting the relative position, each of the drivers 37a to 37c may be formed from an air cylinder, a motor, a transmitter, and the like, for example. The step of the step cam 104 on which the lower end of the stripper stopper 105 is placed can be easily and automatically changed in relation to punching operation by using such a mechanism, contributing to improvement of productivity.

An embodiment of the simultaneous punching-lamination process of the present invention will now be described. An outline of the simultaneous punching-lamination process will be described referring to FIGS. 10(a) to 10(e). FIG. 10(a) shows a first sheet of thin material to be processed 3 placed on a die 12 for preparation of a punching operation. Next, the first sheet of the material to be processed 3 is punched by a punch 10 as shown in FIG. 10(b).

Figure 10C:
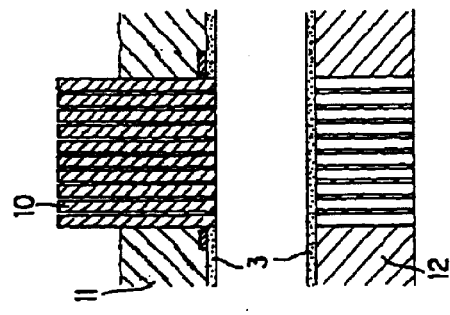
FIGS. 10(a) to (e) are drawings for illustrating an exemplary process of a hole boring using the punch die for punching and laminating simultaneously a plurality of thin sheets according to the present invention.
Figure 10B:
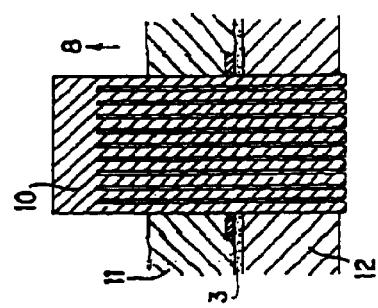

Then, for preparation of the punching operation of the second sheet of the material to be processed 3 as shown in FIG. 10(c), the first sheet of the processed material inserted in the punch 10 is moved upward, with the processed material adhering to the stripper 11. The punch 10 is preferably elevated to the extent that its end comes slightly lower than the bottom surface of the first sheet of the processed material 3. Specifically, as can be seen from the comparison with FIG. 10(a), the punch 10 is preferably elevated so as to protrude from the bottom of the stripper 11 by the thickness of the processed material 3. Such positioning of the punch 10 with respect to the stripper 11 can be performed by the above-mentioned device for adjusting the relative position. If the punch 10 is returned to the center of the hole of the processed material or to be entirely stored in the stripper, the hole may be deformed and precision is impaired, particularly when the processed material is a soft material.

According to the punching-lamination process for laminating a thin sheet of the material to be processed 3, deformation of holes is prevented by the punch 10 itself by using the punch 10 as a lamination axis for the thin processed material 3. As compared with a conventional method in which sheets are laminated outside a stamping machine, the punching-lamination process of the present invention does not require jigs for moving the processed material 3 and a space for piling the processed material 3, and requires a decreased number of steps for manufacturing. Therefore, it is possible to make through-holes with a high aspect ratio at the same high precision as can be achieved when making a hole through a thin sheet of the processed material 3 at a low cost.

Figure 10E:
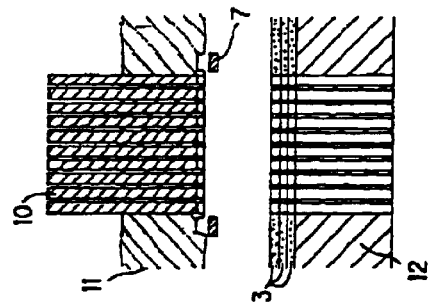
Figure 10A:
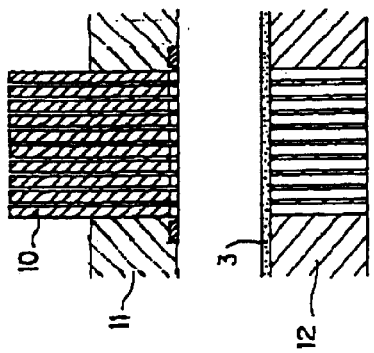
Figure 10D:
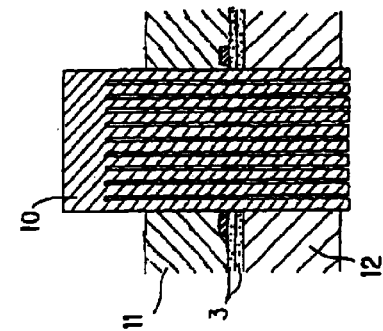

FIG. 10(d) shows a punching step of the second sheet of the material 3 to be processed. Following the punching preparation as shown FIG. 10(c), the steps are repeated for several sheets of the material to be processed 3 to sequentially laminate these sheets in the stamping machine. Then, as shown in FIG. 10(e), when all sheets of the material to be processed 3 have been punched and laminated, the punch 10 is stored in the stripper 11 and the laminated sheets of processed material 3 are removed from the stripper using a jig 7, whereupon the simultaneous punching-lamination process is completed.

When sheets of the processed material 3 are laminated in the punch 10, the sheets are caused to adhere to the stripper 11 or other sheets. This can be achieved by using vacuum adsorption, by previously coating an adhesive over the surface of each sheet of the processed material 3, or by inserting an adhesive sheet. Since the use of an adhesive sheet requires an additional punching step, a method of using a processed material with an adhesive surface is more preferable. In a still another method of laminating sheets of the processed material 3, the punch 10 with a rough surface is used. The rough surface of the punch 10 increases the friction force created between the punch 10 and the processed material 3, thereby enabling the punch 10 to hold the processed material 3. Since the processed material 3 is held by the punch 10, sequentially punched sheets of the processed material 3 are laminated, adhering to the stripper 11.

In general, a punched hole is elastically deformed due to internal stress produced during the punching process to cramp the punch, specifically, to decrease the diameter. The softer the material, the greater the degree of deformation. Accordingly, such a processed material can be held by the punch only if the surface of the punch is roughened.

Figure 11D:
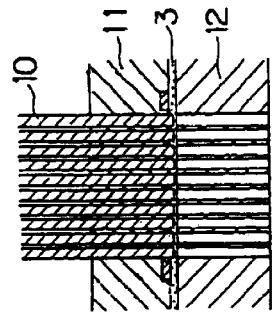
FIGS. 11(a) to (e) are explanatory drawings for showing an example of a hole boring using the punch die for punching and laminating simultaneously a plurality of thin sheets according to the present invention.

Next, details of the above-described punching preparation step for the first sheet of the material to be processed 3 (FIG. 10(a)) and the punching preparation step for the second sheet of the material to be processed 3 (FIG. 10(c)), specifically, details of punching operation for the first sheet, will be described referring to FIGS. 11(a) to 11(f). FIG. 11(a) shows a first thin sheet of the material to be processed 3 placed on a die 12, similar to FIG. 10(a). Next, as shown in FIG. 11(b), the stripper 11 is caused to descend onto the material to be processed 3 on the die 12. In this instance, the punch 10 is still stored in the stripper 11. When the stripper 11 is caused to descend, it is not desirable for the punch 10 to punch out the material to be processed 3 before the stripper 11 touches the material to be processed 3 on the die 12. When descending, the stripper 11 plays a role of holding the punch 10 and, at the same time, the processed material 3. If the processed material 3 is not held, the punching operation will become unstable when the processed material 3 is undesirably rolling. Therefore, punching at a high precision is hindered. In addition, deformation occurring when punching out the material to be processed 3 due to a cause other than the shear stress, such as warping, can also be prevented by the stripper 11. Otherwise, a punch-out operation with a high precision cannot be achieved.

Figure 11C:
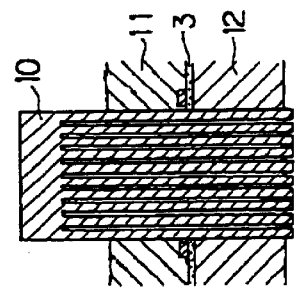
Figure 11B:
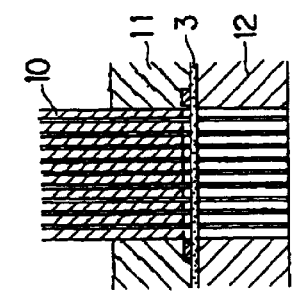

Thereafter, as shown in FIG. 11(c), in the condition in which the stripper 11 touches the material to be processed 3 on the die 12 the material 3 is punched out by the punch 10, whereby the punch 10 is inserted into the die 12. Thereafter, as shown in FIG. 11(d), in the condition wherein the stripper 11 comes onto the material to be processed 3 on the die 12, the material 3 is punched out by the punch 10, whereby the punch 10 is inserted into the die 12. It is desirable not to draw up the stripper 11 at the time of or prior to insertion of the punch 10. Since the processed material 3 is held to be precisely punched out if enclosed by the stripper 11 and die 12, as well as by the punch 10, drawing up the punch 10 while maintaining this arrangement does not result in a decrease in precision.

Figure 11F:
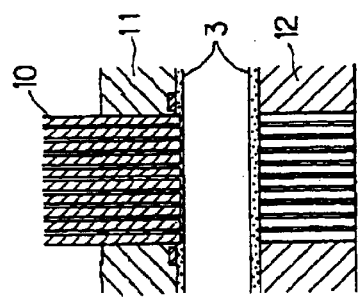
FIG. 11(f) shows a second sheet preparation step.
Figure 11A:
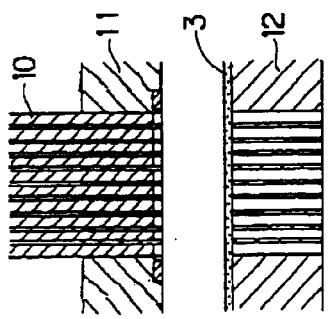
Figure 11E:
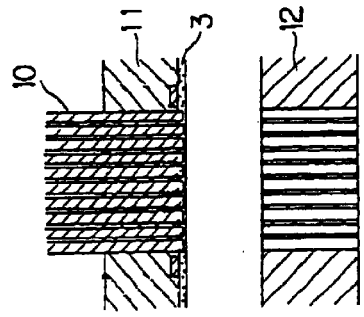

Then, as shown in FIG. 11(e), the stripper 11 is elevated with the processed material 3 being inserted in the punch 10, whereupon the punching operation for the first sheet is completed. FIG. 11(f) is a drawing similar to FIG. 10(c) and shows a preparation step for the second sheet.

Next, the simultaneous punching-lamination process using an easily deformable material will be described referring to FIGS. 13(a) to 13(f). FIGS. 13(a) to 13(f) describe an embodiment of the process for making through-holes with a high aspect ratio in a material to be processed 3 using the punch die for punching and laminating simultaneously a plurality of thin sheets according to the present invention, wherein a stripper stopper 105 is shown to protrude from the die 12 and a clearance is provided between the die 12 and stripper 11 to perform the punching operation.

As mentioned above, although it is possible to make holes with a higher precision by repeating the punching process while laminating the processed material with a hole in the punch, there may still be the case where holes have impaired precision when a soft and easily deformable material is used. During the punching operation, the stripper touches the material to be processed on the die before the punch makes a hole. As a result, the material to be processed is held between the stripper and die, whereby a compressive force is applied to the material to be processed. The processed material through which holes have already been produced or the processed material placed on the die through which holes are still to be opened is also held between the stripper and die and receives a compressive force. If the material is easily deformable by such a compressive force, the processed material laminated in the stripper is crushed and deformed. Since the punch functioning as a lamination axis is fixed, the laminated material is subjected to a relative displacement, which gives rise to a decrease in shape precision of the already produced holes. On the other hand, since the hole is opened by the punch through the material to be processed which is placed on the die 12 and crushed by the stripper, the hole precision is impaired with respect to both the location and shape to the extent of form-return of elastic deformation after the punching.

To make holes at a higher precision through a soft material, it is desirable to punch the processed material by providing a clearance between the die 12 and stripper 11 to avoid a compressive force onto the processed material 3 due to direct contact of the stripper 11 with the material to be processed 3, as shown in FIGS. 13(a) to 13(f).

The stripper stopper 105 shown in FIGS. 13(a) to 13(f) is designed to vertically move in the die 12 so as to change its height protruding from the upper surface of the die 12 and to provide a clearance between the die 12 and stripper 11 during the punching operation, whereby application of a compressive force to the material to be processed 3 due to direct contact of the stripper 11 with the material to be processed 3 can be prevented. The height of the stripper stopper 105 protruding from the upper surface of the die 12 for providing a clearance between the die 12 and stripper 11 can be adjusted by the above-described device for adjusting the clearance.

Figure 13A:
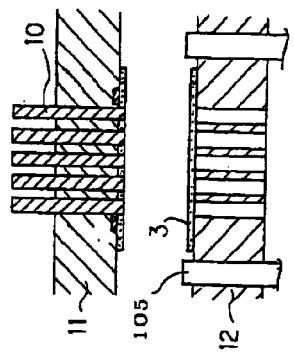
FIGS. 13(a) to (f) are a still another explanatory drawing for showing a still another example of a hole boring using the punch die for punching and laminating simultaneously a plurality of thin sheets according to the present invention.
Figure 13B:
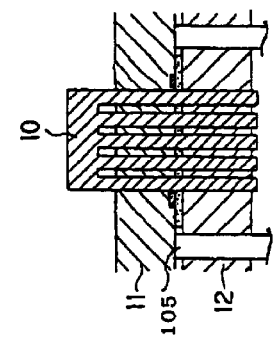

FIG. 13(a) shows a first sheet of the material to be processed 3 placed on a die 12 for preparation of the punching operation. In this instance, the stripper stopper 105 protrudes from the upper surface of the die 12 about 5–15

μm of the thickness of the material to be processed 3 on the die 12. Next, the first sheet of the material to be processed 3 is punched by a punch 10 as shown in FIG. 13(b). In this instance, the stripper 11 does not directly come onto the material to be processed 3, but comes onto the stripper stopper 105 which slightly protrudes above the thickness of the material to be processed 3. Therefore, the material to be processed 3 is not deformed during the punching operation even if the material is extremely soft. Holes with a high precision can be formed by the punching operation.

Figure 13C:
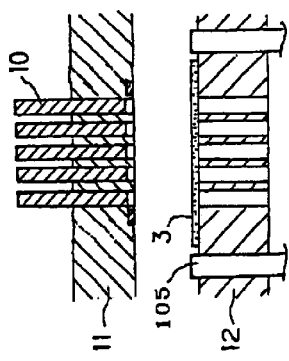

Then, for preparation of the punching operation of the second sheet as shown in FIG. 13(c), the processed material 3 inserted in the punch 10 is moved upward, with the first sheet of the processed material 3 adhering to the stripper 11. The height of the stripper stopper 105 protruding from the upper surface of the die 12 is almost the same as the thickness of the processed material 3. The stripper stopper 105 protrudes about 5–15 μm higher than the total thickness of the processed material 3 drawn up as inserted in the punch 10 and the thickness of the material to be processed 3 on the die 12 which is still to be punched out.

Figure 13D:
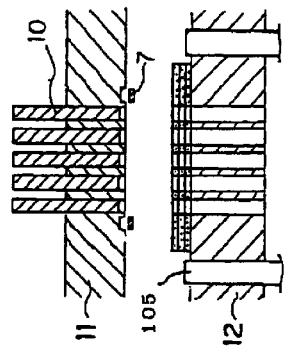
Figure 13E:
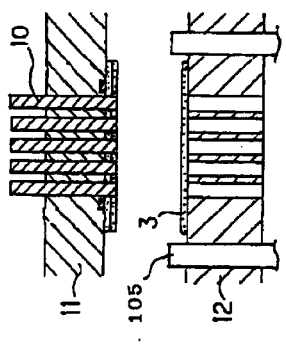
Figure 13F:
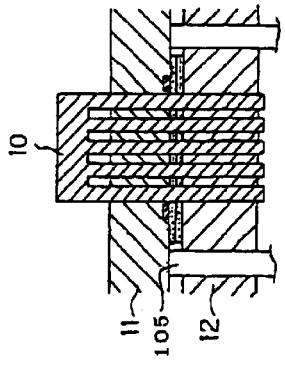

FIG. 13(d) shows a punching step of the second sheet of the processed material 3. In the same way as in the first sheet shown in FIG. 13(b), the stripper 11 does not directly come onto the processed material 3, but onto the stripper stopper 105, thereby preventing the processed material 3 from being deformed. Holes with a high precision can be formed through the processed material. Next, punch-out operation for a third sheet is prepared in FIG. 13(e). In the same manner, the height of the stripper stopper 105 protruding from the upper surface of the die 12 is adjusted so that the stripper stopper 105 protrudes about 5–15 μm higher than the total thickness of the processed material 3 drawn up as inserted in the punch 10 and the thickness of the material 3 on the die 12 which is still to be punched out. These steps are repeated for several sheets of the material to be processed 3 to sequentially laminate these sheets in the stamping machine. Then, as shown in FIG. 13(f), when all sheets of the material to be processed 3 have been punched and laminated, the laminated sheets of processed material 3 are removed from the stripper 11 using a jig 7, whereupon the simultaneous punching-lamination process is completed.

A mechanism for removing the laminated processed material from the stripper in the punching operation using the punch apparatus for punching and laminating simultaneously a plurality of thin sheets according to the present invention will now be described in more detail referring to FIGS. 12(a) to 12(c). As shown in FIG. 10(e), as a mechanism for removing the laminated sheets of processed material 3 from the stripper 11, a removing jig 7 which mechanically removes the processed material 3 adhering to the stripper 11 can be given. In this instance, rather than removing the processed material 3, which has been removed from the die 10 and stripper 11, after putting it on the die 12, a method of putting a work receiving jig on the die and placing the laminated sheets of processed material 3 onto the work receiving jig to transfer it to the next step is more preferable to prevent deviation of the laminated sheets of processed material 3 and to increase productivity. The method is preferably applied when the material to be processed is a soft material because it is difficult for deformation to occur using this method.

Figure 3:
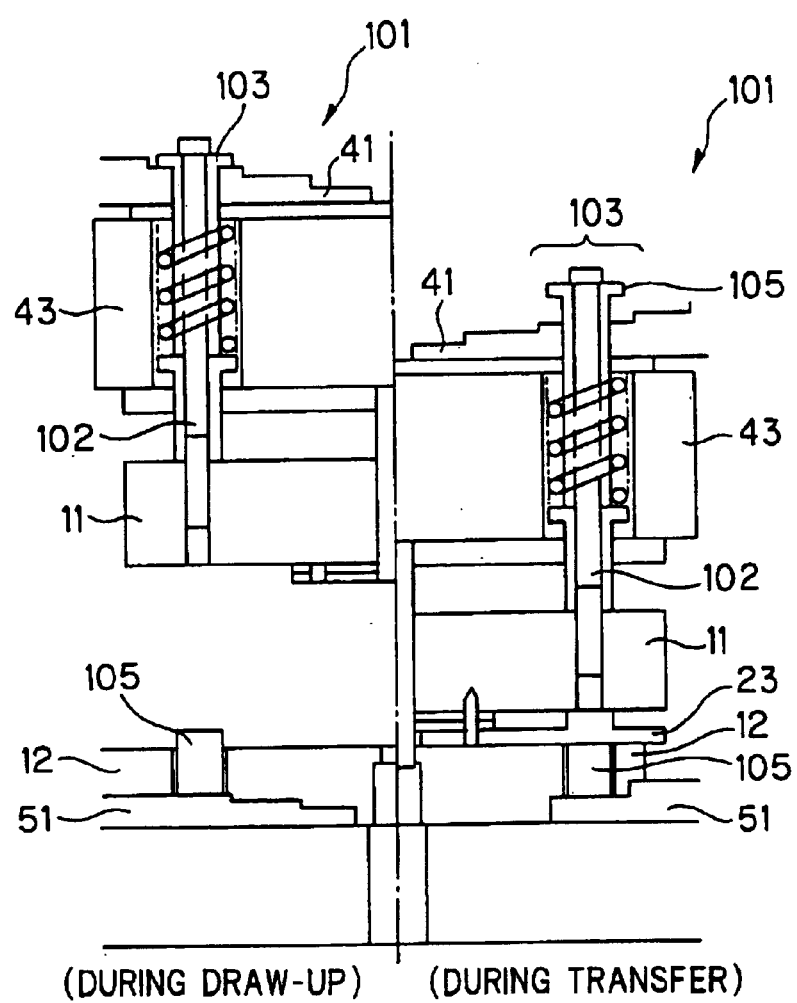
FIG. 3 is another partially enlarged side view of a punch die for the simultaneous punching-lamination process of the present invention, wherein the left side shows the state in which a desired number (n=2) of sheets of the material to be processed have been punched and laminated and the stripper has been drawn up and the right side shows the state in which the processed material laminated in the punch is being transferred onto a work-receiving jig inserted onto the die.
Figure 5A:
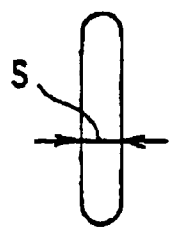
FIGS. 5($a$) and ($b$) are drawings for illustrating a plurality of through-holes with a high aspect ratio which can be formed in a material to be processed using the punch die for punching and laminating simultaneously a plurality of thin plates according to the present invention.
Figure 5B:
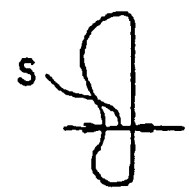

FIGS. 12(a) to 12(c) describe the steps for transferring the laminated processed material onto a work receiving jig, wherein an embodiment for removing three sheets of processed material after lamination and punch-out from the punch and stripper is shown. When a stripper 11 is drawn up with the processed material 3 after lamination and punching adhering therewith as shown in FIG. 12(a), a work receiving jig 23 is inserted and put onto the die 12, as shown in FIG. 12(b). As shown in FIG. 12(c), the punch 10 is drawn up with respect to the stripper 11 to separate the processed material 3 from the punch 10. Then, the laminated sheets of processed material 3 are mechanically removed from the stripper 11 using the peeling jig 7 and transferred onto the work receiving jig 23. Another method is described with reference to FIG. 3, which is a partially expanded side view of the punch apparatus 101 for the simultaneous punching-lamination process shown in FIG. 1. In FIG. 3, the left side shows that an upper portion of die 25 has been drawn up after completion of the simultaneous punching-lamination process (corresponding to FIG. 12(a)). The right side shows the state wherein the laminated sheets of processed material 3 have been separated from the punch 10 and transferred onto a work-receiving jig 23 inserted and put onto the die 12 (corresponding to FIG. 12(c)). Specifically, the left side in FIG. 3 shows the state wherein two sheets of the processed material 3 have been laminated in the punch as an axis. After this, the work-receiving jig 23 is placed on the position shown in the right side of the drawing. The work-receiving jig 23 has a projection with a length equivalent to the thickness of the laminated sheets of processed material 3. The projection functions to prevent the stripper 11 from crushing the processed material 3 when the upper portion of die 25 descends. Next, the upper portion of die 25 is caused to descend to the point shown in the right side of the drawing, whereupon the head 106 and the step cam 103 are separated to cause the punch slide plate 41 to move to the right in FIG. 3. In this instance, the punch slide plate 41 is moved to the right to the extent that the punch is housed in the stripper 11, specifically, to the point where punch and stripper 11 are located before punching out the first sheet of the processed material 3. Finally, the upper portion of die 25 is elevated and the processed material laminated in the punch as an axis is placed on the work-receiving jig 23, which removes the processed material 3 from the punch and stripper. The work-receiving jig 23 can be inserted onto or removed from the die 12 by installing a rotatable post connecting the upper portion of die 25 and lower portion of die 25 in the punch apparatus in FIG. 1, for example. The work-receiving jig 23 is caused to horizontally rotate around the post as a rotation axis to be inserted into or removed from the die 12. Alternatively, a slide plate for installing the work-receiving jig 23, such as a punch slide plate 41 in the upper portion of die 25 or a die slide plate 51 in the lower portion of die 26, is provided. The work-receiving jig 23 is inserted into or removed from the die 12 by causing the slide plate to move straight horizontally back and forward.

EXAMPLES

An example of the punch apparatus for punching and laminating simultaneously a plurality of thin sheets according to the present invention will now be described to confirm the effect of the present invention.

Example

A printed circuit board with through-holes formed therein (each through-hole having a diameter of 80 μm and axis length of 0.8 mm, one through-hole being separated from the next through-hole by an interval of 70 mm) was prepared from a green sheet with a Young's modulus of elasticity of 4 kgf/mm$^2$ using a stamping machine 100 having a punch apparatus 101 shown in FIG. 1. The green sheet had a thickness of 40 μm, of which 20 sheets were laminated in the punch 10 as a lamination axis. The diameter of the through-holes in the obtained printed circuit board was measured to confirm that the diameter was 80 μm on the surface and 80–83 μm on the back of the substrate. As a result of inspection using an optical microscope, no cracks and the like were found on either the surface or back of the substrate.

Comparative Example 1

A printed circuit board was prepared in the same manner as in Example 1, except for using one sheet of unlaminated green sheet having a thickness of 0.8 mm. The diameter of the through-holes in the obtained printed circuit board was measured to confirm that the diameter was 80 μm on the surface and 115–130 Mm on the back of the substrate. As a result of inspection of the surface and back of the substrate using an optical microscope, distorted through-holes were confirmed. In addition, through-holes having cracks on peripheries were found here and there.

Comparative Example 2

A printed circuit board with the same through-holes as in Example 1 formed therein was prepared from a green sheet with a Young's modulus of elasticity of 4 kgf/mm$^2$ using a laser beam process machine. In the same manner as in Comparative Example 1, one green sheet with a thickness of 0.8 μm was used. The diameter of the through-holes in the obtained printed circuit board was measured to confirm that the diameter was 80 μm on the surface and 40–69 μm on the back of the substrate. As a result of inspection of the surface and back of the substrate using an optical microscope, distorted through-holes were confirmed, some through-holes had impaired circularity, and there were through-holes with burrs or cuts on the periphery.

As described above, the punching process using the punch apparatus for punching and laminating simultaneously a plural sheet of the material to be processed according to the present invention can produce industrial parts in which minute through holes with a high aspect ratio are formed densely and at a high degree of precision which have not been attained by using a conventional mechanism, without producing deformation or cracks.

As described above, the punch apparatus punching and laminating simultaneously a plurality of sheets of the material to be processed according to the present invention can form very fine through-holes, having a diameter of 100 μm or less, for example, and a ratio of the axis length to the diameter larger than a prescribed value, specifically, through-holes which are minute and have a high aspect ratio, at a high density and a high precision equivalent to holes made through a sheet of thin material to be processed, even if the material to be processed is soft and deformable. If industrial parts having through-holes with a high aspect ratio are manufactured by using the punch apparatus for punching and laminating simultaneously a plurality of sheets of the material to be processed, such industrial parts can contribute to improvement of the mounting technology of industrial parts. One may expect such a superior effect that more compact and convenient products to consumers is supplied.

What is claimed is:

1. A punch apparatus for punching and laminating a plurality of thin sheets simultaneously, comprising:
   a punch provided on an upper portion of said punch apparatus, said punch defining a lamination axis during lamination of the thin sheets to be processed;
   a die for punching out the thin sheets to be processed, provided on a lower portion of said punch apparatus;
   a stripper for guiding the punch;
   a device for automatically adjusting a position of said stripper relative to said punch so as to retain a first processed thin sheet in contact with said stripper until a final thin sheet has been processed; and
   a device for adjusting a clearance between said die and said stripper during punching.

2. The punch apparatus according to claim 1, wherein said device for automatically adjusting a position of said stripper relative to said punch further comprises:
   a punch holder for holding said punch;
   a first step cam provided above said punch holder;
   a stripper hanger comprised of a shaft and a head, wherein said shaft is secured to said stripper and said head is placed on at least one of said punch holder and said first step cam; and
   a mechanism for changing a step of said first step cam.

3. The punch apparatus according to claim 1, wherein said device for adjusting the clearance between said die and said stripper further comprises:
   a die plate for holding said die and receiving said stripper during a punching operation;
   a second step cam formed below said die plate;
   a stripper stopper provided through said die, said stripper stopper comprising a shaft, the upper end of which protrudes from said die and the lower end of which contacts at least one of said die plate and said second step cam; and
   a mechanism for changing a step of said second step cam.

4. The punch apparatus according to claim 1, wherein said device for adjusting a clearance between said die and said stripper functions automatically.

5. The punch apparatus according to claim 3, wherein said device for adjusting a clearance between said die and said stripper automatically changes a step of said second step cam.

6. The punch apparatus according to claim 1, wherein said clearance is set at about 5–15 μm larger than a total thickness of laminated thin sheets sandwiched between said die and said stripper.

7. A punch apparatus for punching and laminating a plurality of thin sheets simultaneously, comprising:
   a punch provided on an upper portion of said punch apparatus, said punch defining a lamination axis during lamination of the thin sheets to be processed;
   a die for punching out the thin sheets to be processed, provided on a lower portion of said punch apparatus;
   a stripper for guiding the punch, said stripper being in a first static position relative to said punch prior to processing a first thin sheet;
   a device for automatically adjusting the position of said stripper relative to said punch to a second static position, wherein a dimensional difference between the first and second static positions measured along the lamination axis is substantially equal to the thickness of the first thin sheet or multiples thereof; and
   a device for adjusting a clearance between said die and said stripper during punching.

8. The punch apparatus according to claim 7, wherein a portion of said punch extends beyond an outer surface of said stripper when in said second static position.

9. The punch apparatus according to claim 8, wherein said portion of said punch holds at least the first thin sheet after it is processed.

* * * * *